(12) United States Patent
BeVier et al.

(10) Patent No.: US 9,419,177 B2
(45) Date of Patent: Aug. 16, 2016

(54) COMPOSITIONS, DEVICES AND METHODS FOR OPTIMIZING PHOTOSYNTHETICALLY ACTIVE RADIATION

(71) Applicant: General Hydroponics, Inc., Santa Rosa, CA (US)

(72) Inventors: Jonathan Austin BeVier, Santa Rosa, CA (US); Charles Hugo Ostman, Sebastopol, CA (US); Larwence L. Brooke, Sebastopol, CA (US)

(73) Assignee: HGCI, Inc., Las Vegas, NV (US)

( * ) Notice: Subject to any disclaimer, the term of this patent is extended or adjusted under 35 U.S.C. 154(b) by 152 days.

(21) Appl. No.: 13/750,776

(22) Filed: Jan. 25, 2013

(65) Prior Publication Data

US 2013/0187126 A1    Jul. 25, 2013

Related U.S. Application Data

(60) Provisional application No. 61/590,726, filed on Jan. 25, 2012.

(51) Int. Cl.
| | |
|---|---|
| *C09K 11/77* | (2006.01) |
| *H01L 33/26* | (2010.01) |
| *H01L 33/06* | (2010.01) |

(52) U.S. Cl.
CPC ............ *H01L 33/26* (2013.01); *C09K 11/7766* (2013.01); *C09K 11/7773* (2013.01); *C09K 11/7776* (2013.01); *C09K 11/7794* (2013.01); *H01L 33/06* (2013.01)

(58) Field of Classification Search
CPC .... C09K 11/02; C09K 11/025; C09K 11/777; C09K 11/7706; C09K 11/7708; C09K 11/7733–11/7797; B82Y 15/00; B82Y 20/00
USPC ........ 252/301.4 R, 301.4 F, 301.4 P, 301.4 H, 252/301.6 R, 301.4 S, 301.6 S, 301.6 F, 252/301.6 P, 301.36, 301.5, 501.1; 428/402, 428/403, 432, 690
See application file for complete search history.

(56) References Cited

U.S. PATENT DOCUMENTS

| | | | | |
|---|---|---|---|---|
| 2004/0012951 A1* | 1/2004 | Pylkki et al. | .................. | 362/152 |
| 2005/0260764 A1* | 11/2005 | Grigsby, Jr. | ........ | G01N 21/6428 436/172 |
| 2006/0010775 A1* | 1/2006 | Tao et al. | ......................... | 49/375 |
| 2006/0157686 A1* | 7/2006 | Jang | ....................... | B82Y 10/00 257/14 |
| 2007/0148082 A1* | 6/2007 | Heidelberg | ............ | B82Y 30/00 423/594.17 |
| 2007/0251996 A1* | 11/2007 | Kanevsky | .......... | G07C 9/00158 235/380 |
| 2009/0169861 A1* | 7/2009 | Nie | ....................... | B01J 19/0046 428/315.5 |
| 2010/0209602 A1* | 8/2010 | Davis et al. | .................... | 427/157 |
| 2010/0253599 A1* | 10/2010 | Szczerba et al. | .................... | 345/7 |
| 2011/0080451 A1* | 4/2011 | Radke | .................. | C09D 11/322 347/51 |
| 2011/0121260 A1 | 5/2011 | Jang et al. | | |
| 2011/0127445 A1* | 6/2011 | Zhang | ................. | A61K 41/0071 250/459.1 |
| 2012/0113671 A1* | 5/2012 | Sadasivan | ............. | C09D 11/101 362/602 |

FOREIGN PATENT DOCUMENTS

| | | |
|---|---|---|
| WO | WO 2006/005005 A2 | 1/2006 |
| WO | WO2010-053341 A1 | 5/2010 |
| WO | WO 2010/074528 A2 | 7/2010 |

OTHER PUBLICATIONS http://www.livephysics.com/physical-constants/optics-pc/wavelength-colors/, printed Sep. 30, 2014.*
International Search Report for PCT/US2013/6023267 mailed May 15, 2013.

* cited by examiner

*Primary Examiner* — Jonathan Johnson
*Assistant Examiner* — Lynne Edmondson
(74) *Attorney, Agent, or Firm* — Brooks Acordia IP Law, PC; Pejman Yedidsion; Christopher Weiss

(57) ABSTRACT

Compositions, devices, and methods for optimizing photosynthetically active radiation by utilizing a composition comprising a quantum confinement material having an emission spectra of between 300 nm and 545 nm, and a quantum confinement material having an emission spectra of between 545 nm and 750 nm where the composition may be embedded in and/or coated on one or more transparent surfaces.

6 Claims, 5 Drawing Sheets

COMPOSITIONS, DEVICES AND METHODS FOR OPTIMIZING PHOTOSYNTHETICALLY ACTIVE RADIATION

CROSS-REFERENCE TO RELATED APPLICATIONS

This application claims priority to and benefit of Provisional Patent Application No. 61/590,726 filed Jan. 25, 2012, the contents of which are hereby incorporated by reference herein for all purposes.

TECHNICAL FIELD

The present invention relates generally to nanomaterials, and, in some aspects, to nanomaterials for use with devices for emitting light spectrum. In other aspects, the present invention relates to nanoscale quantum confinement materials, compositions, devices, and methods. In particular embodiments, the present invention relates to compositions, devices, and methods for converting electromagnetic wave energy into photonic wavelengths optimized for the process of photosynthesis.

BACKGROUND

Artificial lighting for plant growth may be energy intensive. Conventional light sources emit electromagnetic spectrum in a broad range of visible and non-visible light, but only part of this spectrum is relevant for photosynthesis. Therefore, for plant growth, much of the energy delivered by lighting sources is wasted on these non-optimized spectrum emissions. Further energy waste may occur due to the use of various types of conventional high pressure lighting, such as high pressure sodium (HPS) lights, which require energy for ignition. This energy is not converted to light, but is instead shed as wasted heat and/or as spectral emissions not utilized during the photosynthesis process.

SUMMARY

Exemplary composition embodiments may comprise: (a) a quantum confinement material having an emission spectra of between 300 nm and 545 nm; and (b) a quantum confinement material having an emission spectra of between 545 nm and 750 nm. In additional exemplary composition embodiments the quantum confinement material of subpart (a) may be comprised of a 20-50 nm thulium doped yttrium vanadate colloid having an excitation wavelength of 300 nm and an emission wavelength of 477 nm. In additional exemplary composition embodiments the quantum confinement material of subpart (a) may be in a solvent containing <0.7 mg/ml polyvinylpyrrolidone. In additional exemplary composition embodiments the quantum confinement material of subpart (b) may be comprised of a composition selected from among: a 20-50 nm europium doped yttrium vanadate colloid having an excitation wavelength of 300 nm and an emission wavelength of 620 nm; a 10 nm europium doped yttrium vanadate colloid having an excitation wavelength of 350 nm and an emission wavelength of 617 nm; a 10-50 nm samarium doped yttrium vanadate colloid having an excitation wavelength of 300 nm and an emission wavelength of 650 nm; a 25 nm NaYF4:YBEr colloid having an excitation wavelength of 980 nm and an emission wavelength of 545 nm; and an atomic graphene layer with defect points enabling quantum confinement active zones. In additional exemplary composition embodiments the 20-50 nm europium doped yttrium vanadate colloid having an excitation wavelength of 300 nm and an emission wavelength of 620 nm may be in a solvent of <0.7 mg/ml polyvinylpyrrolidone. In additional exemplary composition embodiments the 10 nm europium doped yttrium vanadate colloid having an excitation wavelength of 350 nm and an emission wavelength of 617 nm may be in a solvent of H2O. In additional exemplary composition embodiments the 10-50 nm samarium doped yttrium vanadate colloid having an excitation wavelength of 300 nm and an emission wavelength of 650 nm may be in an aqueous solution containing trace citrate if the samarium doped yttrium vanadate colloid is 10 nm, and may be in a solution of less than 0.7 mg/ml polyvinylpyrrolidone if the samarium doped yttrium vanadate colloid is 50 nm. In additional exemplary composition embodiments the 25 nm NaYF4:YBEr colloid having an excitation wavelength of 980 nm and an emission wavelength of 545 nm may be in a solvent containing hexane. In additional exemplary composition embodiments the composition may further comprise a moiety selected from among a solvent and an adhesive. In additional exemplary composition embodiments the solvent may be selected from among water, polyvinylpyrrolidone, and hexane. In additional exemplary composition embodiments the adhesive may be selected from among an anaerobic adhesive, a cyanoacrylate adhesive, an epoxy, a structural acrylic, and an ultraviolet light curable adhesive. In additional exemplary composition embodiments the composition may be at least one of: coated on a transparent solid material and embedded into a transparent solid material. In additional exemplary composition embodiments the transparent solid material may comprise at least one of: silica glass, a carbon polymer, and a ceramic.

Exemplary composition embodiments may also comprise a 50.01%-99% w/w quantum confinement material preparation having a concentration of 10 mg/ml solvent with an excitation wavelength of 980 nm that emits blue light; and a 1.00%-49.99% w/w quantum confinement material preparation having a concentration of 10 mg/ml solvent with an excitation wavelength of 300 nm that emits red light.

Exemplary composition embodiments may also comprise a 1.0%-49.99% w/w quantum confinement material preparation having a concentration of 10 mg/ml solvent with an excitation wavelength of 980 nm that emits blue light; and a 50.01%-99.0% w/w quantum confinement material preparation having a concentration of 10 mg/ml solvent with an excitation wavelength of 300 nm that emits red light.

Exemplary composition embodiments may also comprise a 50% w/w quantum confinement material preparation having a concentration of 10 mg/ml solvent with an excitation wavelength of 980 nm that emits blue light; and a 50% w/w quantum confinement material preparation having a concentration of 10 mg/ml solvent with an excitation wavelength of 300 nm that emits red light.

Exemplary device embodiments may comprise a transparent surface comprising a material selected from at least one of: silica glass, a carbon polymer, and a ceramic; and a composition, where the composition may be at least one of: coated on the transparent surface and embedded within the transparent surface, and where the composition may comprise: a quantum confinement material having an emission spectra of between 300 nm and 545 nm comprised of a material selected from among a 20-50 nm thulium doped yttrium vanadate colloid having an excitation wavelength of 300 nm and an emission wavelength of 477 nm; and a quantum confinement material having an emission spectra of between 545 nm and 750 nm comprised of a material selected from among: a 20-50 nm europium doped yttrium vanadate colloid having an excitation wavelength of 300 nm and an emission wavelength of 620 nm; a 10 nm europium doped yttrium vanadate colloid having an excitation wavelength of 350 nm and an emission wavelength of 617 nm; a 10-50 nm samarium doped yttrium vanadate colloid having an excitation wavelength of 300 nm and an emission wavelength of 650 nm; a 25 nm NaYF4:YBEr colloid having an excitation wavelength of 980 nm and an emission wavelength of 545 nm; and an atomic graphene layer with defect points enabling quantum confinement active zones. In additional exemplary device embodiments the device may further comprise at least one of: a solvent and an adhesive. In additional exemplary device embodiments the device may further comprise one or more additional transparent surfaces. In additional exemplary device embodiments the transparent surface may be at least partially adhered to at least one of the one or more additional transparent surfaces. In additional exemplary device embodiments the device may further comprise at least one light source. In additional exemplary device embodiments the at least one light source may be comprised of a metal halide light bulb, a high pressure sodium light bulb, a fluorescent light bulb, an incandescent light bulb, field induced polymer electroluminescence (FIPEL), and a light emitting diode (LED). In additional exemplary device embodiments the transparent surface may be framed by at least one of: a casement and a sash.

Exemplary composition embodiments may also comprise a quantum confinement material having an emission spectra of between 300 nm and 550 nm comprising a 20-50 nm thulium doped yttrium vanadate colloid having an excitation wavelength of 300 nm and an emission wavelength of 477 nm; and a quantum confinement material having an emission spectra of between 550 nm and 750 nm comprised of a material selected from among: a 20-50 nm europium doped yttrium vanadate colloid having an excitation wavelength of 300 nm and an emission wavelength of 620 nm; a 10 nm europium doped yttrium vanadate colloid having an excitation wavelength of 350 nm and an emission wavelength of 617 nm; a 10-50 nm samarium doped yttrium vanadate colloid having an excitation wavelength of 300 nm and an emission wavelength of 650 nm; and an atomic graphene layer with defect points enabling quantum confinement active zones.

BRIEF DESCRIPTION OF DRAWINGS

Embodiments are illustrated by way of example and not limitation in the figures of the accompanying drawing, and in which.

DETAILED DESCRIPTION

Figure 1:
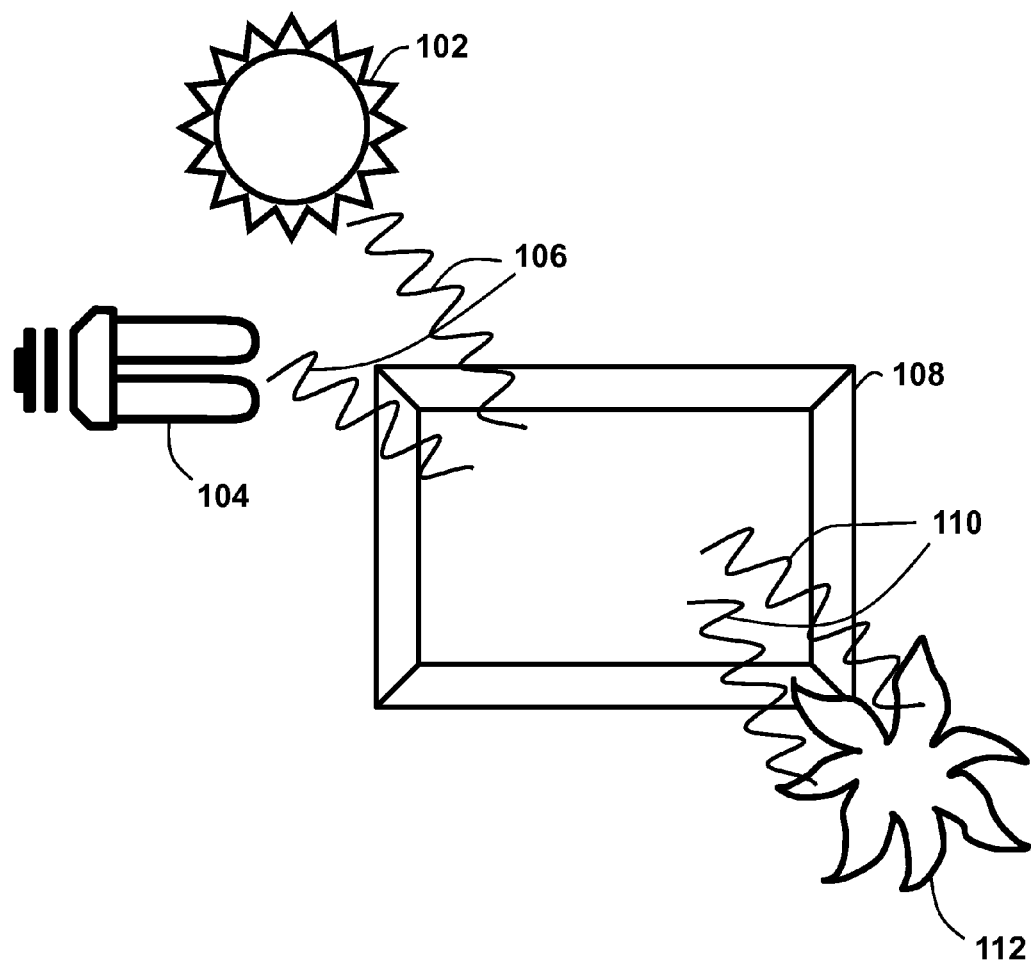
FIG. 1 depicts an exemplary device comprising red-emitting and blue-emitting quantum confinement materials on a solid transparent surface.

The present invention involves the conversion of non-photosynthetically active radiation, e.g., UV radiation and IR radiation that a high pressure sodium ("HPS") light source produces, to photosynthetically active radiation. As a result, the energy efficiency of a light source may be improved for certain uses. The use of quantum dots and/or nanostructured quantum confinement materials, with emission spectra optimized for photosynthesis, is contemplated for tailoring light wavelengths to optimize plant growth and reproduction.

Quantum dots are a portion of matter that may be prepared to emit light in selected wavelengths upon photoactivation due to the process of exciton confinement in all three spatial dimensions. In this way, quantum dots may be viewed as converting electromagnetic radiated energies from a single wavelength, or range of wavelengths, to a specific emission wavelength. One may prepare quantum dots to emit only a particular, selected wavelength. Because energy is not being used to produce other wavelengths, quantum dots are efficient at converting radiated energy. This process is not strictly limited to quantum dots, but may also be extended to nanostructured materials that exhibit quantum confinement properties in one, two, or all three dimensions. Therefore, this invention provides a platform for energy conversion with nanostructured materials that can efficiently optimize the performance of photosynthesis related processes. The present invention contemplates compositions, devices, and methods in various embodiments.

Although artificial light and Sunlight can both emit photosynthetically active radiation, these light sources may also emit additional electromagnetic radiation that may not be useful for plant growth and reproduction. The use of energy that is not photosynthetically active may increase a crop cost in energy costs and/or plant growth. In situations where suitable light is insufficient, plants may adapt in situ. Thus, plants may expend energy otherwise useful for growth, or fruiting, in positioning stems or leaves to optimize light exposure.

In general, where particular measurements are stated, the measurements may be a function of fluctuations or averages, or means, of a population. For example, in a population of quantum confinement materials, some may be excited at the stated wavelength, some may be excited at a lower wavelength, and some may be excited at a higher wavelength. The stated nanometer wavelengths, with respect to the present quantum confinement materials, contemplate such variation within a population. While quantum confinement materials themselves are expressed from time to time herein in terms of size, in general, this refers to the size of the particular intact quantum confinement material in at least one dimension. This may be extended to two and three dimensional structures whose volumetric dimensions express the same quantum confinement characteristics. Similarly, there may be variation with respect to wavelengths emanating from a light source, e.g., Sunlight or a HPS light.

Quantum Confinement Materials:

Quantum confinement materials may be expressed in terms of one, two, or three dimensional quantum confinement mechanisms. These mechanisms are volumetric confinement spatial regions that may be presented as voids, defects, cavities, or solid nanostructures demonstrating confinement of excitons. Materials demonstrating these properties may consist of individual dots, particles, and/or matricies of volumetric structures that satisfy these requirements.

Quantum Dot Compositions

Quantum dots are portions of matter with emission properties dependent on their size. They are small, semiconducting particles that emit light due to quantum confinement. The present invention contemplates the use of quantum dots having a blue emission spectra or a red emission spectra, and mixtures thereof, which is suitable for photosynthetically active radiation. In some embodiments, quantum dots with additional emission spectra may also be used, depending on the species of plant targeted (see FIG. 6). The quantum dots utilized in the invention may be free of heavy metals, e.g., cadmium free quantum dots. In these embodiments, toxicity may be minimized, resulting in increased practicability in the use and disposal of quantum-dot containing materials.

Defected Matrix Compositions

Purposefully produced point defects, such as elemental isotopes, substitution atoms, and vacancies may demonstrate quantum confinement characteristics. Two-dimensional structures of atoms may be utilized as a functional substrate for producing such material properties. As an example, graphene may be altered at specific points along the molecular matricies to induce such effects.

Solid Nanostructures

Quantum confinement may also be achieved via a range of configurations including nanoscale tubes, rods, cones, crystals, spheres, lattices, wells, and cavities that may be constructed with a variety of materials. The materials utilized to produce these effects may not possess hazardous or toxic properties.

Emission of Photosynthetically Active Radiation

The quantum confinement materials utilized in the invention should emit light that is usable by plants for photosynthesis. Light wavelengths suitable for optimum photosynthesis may depend on a number of factors. The term "light" as used herein refers generally to the portion of the electromagnetic spectrum that is in the visible range. A monochromatic light emitting wavelength of 430 nm and a monochromatic light emitting wavelength of 662 nm are generally suitable for photosynthesis, but not exclusively. Chlorophyll, the predominant light-absorbing pigment in plants, reflects, rather than absorbs, green light. The absorption of light by chlorophyll is at a maximum at 430 nm and 662 nm, roughly corresponding to maximum photosynthesis rates in green plants. The present invention contemplates the emission of blue visible light and red visible light. Blue visible light corresponds to a range of about 400-500 nm. One prophetic embodiment of the present invention contemplates a blue visible light emission in a range selected from 400-430 nm, 430-470 nm, and 470-500 nm. For green plants, the blue range is 450-470 nm. One may use a blue emission wavelength of 470 nm. Red visible light corresponds to a range of about 600-700 nm. A prophetic embodiment of the present invention contemplates a red visible light emission in a range selected from 600-630 nm, 630-670 nm, and 670-700 nm. For most green plants, the red range is 650-670 nm. One may use a red emission wavelength of 662 nm (see FIG. 6).

As used herein, the exact wavelengths may vary, e.g., up to 1 nm and any portion thereof. For instance, the range of 400 nm-500 nm may be 399 nm, 400 nm, and 401 nm to 499 nm, 500 nm, and 501 nm. The wavelengths contemplated are those useful for photosynthesis by a plant in its various growth and reproduction stages.

Plants also have other pigments, accessory pigments, which absorb the light of different wavelengths and may aid in energy conversion. In addition to chlorophyll, plants have other components that perceive light quality, such as light color. Phytochrome, for example, is particularly sensitive to the amount of red light (R) relative to the amount of far-red (FR) light. Far red light is at the extreme end of the visible spectrum, at 700-800 nm. For example, for floriculture crops the ratio of red to far-red (R:FR) may have an effect on stem and leaf growth, to the deleterious effect on flowering. In general, plants that grow best under full Sun conditions are more responsive to R:FR than are shade tolerant plants. Other plant pigments include carotenoids, anthocyanins, and betalains. Thus, one may determine what pigments are in the plant, correlate these with light wavelengths, and then optimize wavelength absorption, while accounting for reflection.

Light Source for Conversion to Wavelengths Optimized for Photosynthesis

In general, the light wavelengths so emitted by a light source may be up-converted, i.e., made shorter, or down-converted, i.e., made longer. For plant growth under artificial light, light sources may be of any type. Metal halide, high pressure sodium, fluorescent, incandescent, and light emitting diode (LED) light sources may be used as light sources. Lighting may be fully or partially artificial, and may be in addition to full or partial Sun.

For purposes of energy efficiency, one may choose to coordinate the quantum confinement materials with the range of electromagnetic spectrum emitted by the light source. For example, where a light source has a predominant light emission at 500-600 nm, one will select quantum confinement materials that are excited at 500-600 nm to emit photosynthetically active radiation.

Particular Quantum Confinement Materials

In general, one may select quantum confinement materials that absorb green light and are photoactivated to emit red or blue light. Below are particular, non-limiting examples. The present invention contemplates the use of a variety of quantum confinement materials emitting the desired wavelengths as described herein.

TABLE 1

RED EMITTING QUANTUM CONFINEMENT MATERIALS

| Excitation Wavelength | Emission Wavelength | Composition | Size | Solvent |
|---|---|---|---|---|
| 300 nm | 620 nm | Europium doped yttrium vanadate colloid | 20-50 nm | <0.7 mg/mL PVP |
| 350 nm | 617 nm | Europium doped yttrium vanadate colloid | 10 nm | $H_2O$ |
| 300 nm | 650 nm | Samarium doped yttrium vanadate colloid | 10-50 nm | Aqueous colloid with trace of citrate (10 nm); <0.7 mg/mL PVP (50 nm) |
| 980 nm | 545 nm | NaYF4:YbEr Colloid | 25 nm | Hexane |

TABLE 2

BLUE EMITTING QUANTUM CONFINEMENT MATERIALS

| Excitation Wavelength | Emission Wavelength | Composition | Size | Solvent |
|---|---|---|---|---|
| 300 nm | 477 nm | Thulium doped yttrium vanadate colloid | 20-50 nm | <0.7 mg/mL PVP |
| 980 nm | 545 nm | NaYF4:YbEr Colloid | 25 nm | Hexane |

The present invention contemplates mixtures of quantum confinement materials to capture desired emission wavelengths. For example, both europium doped yttrium vanadate colloid and samarium doped yttrium vanadate colloid are activated at 300 nm to emit red light, yet the red spectrum is different, with emission wavelengths at 620 nm and 650 nm, respectively. In some embodiments of the present invention, these quantum confinement materials may be used in combination, which will result in both being excited at the same wavelength, 300 nm, but emitting two selective red wavelengths, 620 nm and 650 nm, respectively.

The activation wavelengths, and emission wavelengths, as noted, may vary by 0.5 nm, plus or minus the stated wavelength. The present activation wavelengths are thought to activate the subject quantum confinement materials to emit the desired spectrum wavelengths suitable for photosynthesis of a plant in its various stages of growth and reproduction.

Functional Groups and Particles

The present quantum confinement materials may be functionalized such that they have additional capabilities, such as association/disassociation with an additional moiety. For example, the quantum confinement materials used throughout the embodiments of the present invention may further comprise miscibility-enhancing ligands attached to their surface to aid in mixing with the polymers.

Additives

Other moieties may be included in a quantum confinement material mixture. These moieties may be solvents, dispersion agents, and adhesives.

Depending on the desired final composition, suitable agents may be used to disperse quantum confinement material to a desired final density. Colloidal quantum confinement materials in solution may have a size distribution that may affect their emission spectra. When using a solvent that acts as a dispersion agent one will take into consideration the effects of such a dispersion agent on the emission spectra of the subject quantum confinement materials, the overall ingredients of the quantum confinement material dispersion, and the concentration of the quantum confinement materials and any other moiety in solution. The solvents set forth in Tables 1 and 2 above may be used.

Optionally, depending on the final desired composition, suitable adhesives may be used to adhere, or bond, quantum confinement materials and compositions to a solid surface. An adhesive may be a composition that is originally in liquid form, i.e., a predominantly disordered state that permits the composition constituents to take the shape of a surrounding container, and later solidifies, i.e., to an ordered state, restricting the movement of constituents. Such solidification may be by depletion of water or oxygen or through a solidification agent, e.g., a chemical, or ultraviolet light. Suitable adhesives, depending on the composition and the end use, may include anaerobic adhesives, cyanoacrylate adhesives, epoxies, e.g., one-part or two-part, structural acrylics, and ultraviolet light curable adhesives.

Formulations

The present quantum confinement material compositions may be prepared as a coating, that is, a composition applied to a substrate, or may be integrated into a substrate itself.

Quantum confinement materials emitting the desired wavelengths may be applied to a solid substrate as a coating. The present compositions comprising quantum confinement materials having emission spectra optimized for photosynthesis may be a liquid or gel, and may be prepared so as to facilitate spraying or painting on to a solid substrate. One may prepare such a coating by dispersing suitable quantum confinement materials in a dispersion solvent, applying the mixture to a solid substrate, and drying the mixture to remove the dispersion solvent from the mixture. A number of factors may be considered when preparing such a formulation so that the emission wavelength of choice is emitted without undue interference. The dispersion agent should permit transmission of the desired wavelength, the concentration of the quantum confinement materials can influence the intensity of light emitted, and the optical properties of the dispersion agent should be such that light scatter does not unduly interfere with the desired light so emitted. Coatings may be further formulated into oils or gels for application to a solid substrate. Application may be by dipping, spraying, painting or any other method.

Similar consideration may be taken into account for quantum confinement materials integrated into solid substrates. Quantum confinement materials emitting the desired wavelengths may be integrated into a substrate, as integrating into a polymeric matrix. For example, the present invention provides matrix materials doped with quantum confinement materials that have specific emission and/or absorption characteristics, and also allow for specific tailoring of spectral conversion indecies of the nanocomposites. In one embodiment, the present invention provides polymeric layers comprising a polymer and quantum confinement materials embedded within the polymer, wherein the quantum confinement materials have a size and a composition such that they emit red, far red, or blue light, and wherein the polymeric layers scatter a minimal portion of light that enters the layers. In certain embodiments, the polymer may be silicone. The polymeric layers of the present invention may be used to coat solid substrates, such as transparent solid substrates and optical devices, e.g., refractive lenses or reflective elements, or may be used to encapsulate active devices, e.g., light emitting diodes (LEDs) and field induced polymer electroluminescent materials (FIPEL). The density of quantum confinement structures throughout the substrate, such as polymer, may be uniform, a gradient, or any other desired distribution. The thickness of the polymeric coating will depend on the desired final characteristics. In certain embodiments, the polymeric layer used as a coating may have a thickness of 0 mm to 1 mm, 1 mm to 5 mm, 5 mm to 10 mm (1 cm), and of any integer in between.

Devices

The present devices comprise the present quantum confining material compositions disposed on or within a surface such that the present material may be sufficiently activated to emit photosynthetically active radiation. In some embodiments, the present devices comprise a quantum confinement material composition disposed on or within a surface, and a light source capable of activating the quantum dots. In some embodiments, the present devices comprise quantum dots that emit red light and are activated by a first activation wavelength, and quantum dots that emit a blue light and are activated by a second activation wavelength. These devices are not limited to the use of quantum dots, but can encompass the use of any quantum confining materials.

Configuration

Embodiments of the present devices may be configured in a variety of ways. For instance, the present devices may to be used with a natural light source, an artificial light source, or a combination of light sources.

FIG. 1 depicts an exemplary device 108 comprising red-emitting and blue-emitting quantum confinement materials on a solid transparent surface. A light source, here, the Sun 102 or an artificial light source 104 emits electromagnetic spectrum 106 that is exposed to a device of the present invention 108 comprising red-emitting and blue-emitting quantum confinement materials, e.g., quantum dots, nano structured graphene, etc., on a solid transparent surface. This results in photosynthetically active radiation—shorter blue, longer red—being selectively amplified 110 in the presence of photosynthesizing plant 112.

Figure 2:
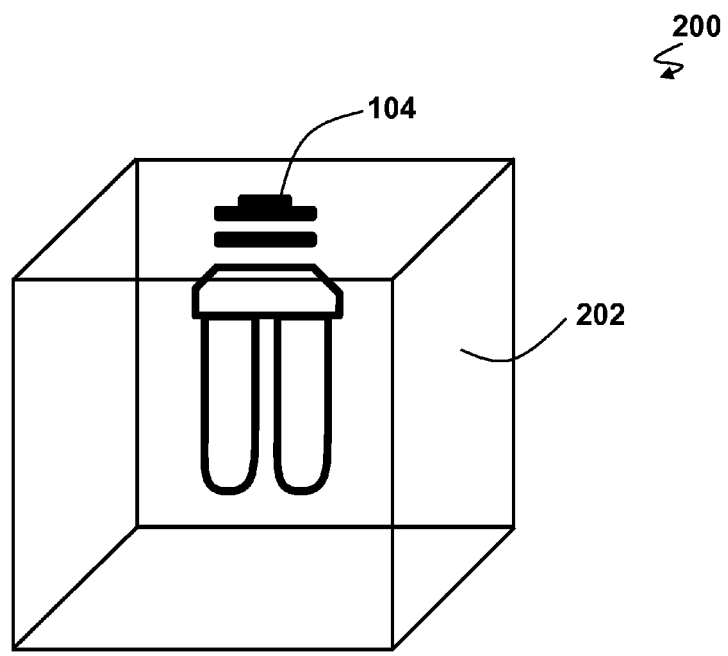
FIG. 2 depicts an exemplary device comprising a light source surrounded by a transparent structure.

FIG. 2 depicts an exemplary device 200 comprising a light source 104 surrounded by a transparent structure 202.

Figure 3:
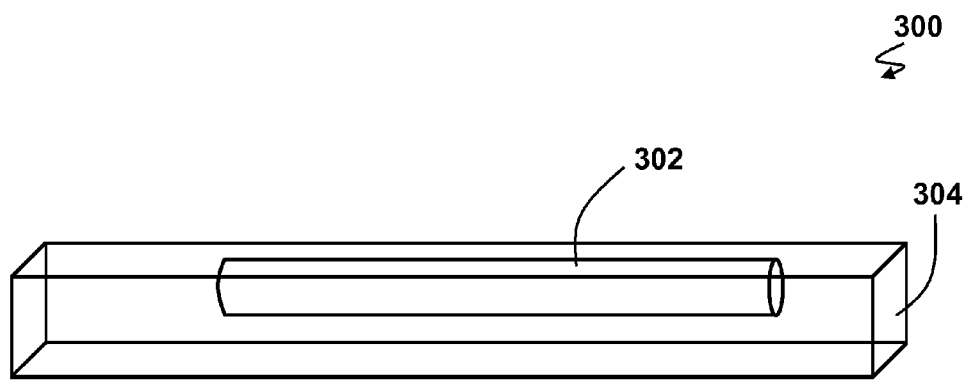
FIG. 3 depicts an exemplary device comprising a tube-shaped light source surrounded by a transparent structure.

FIG. 3 depicts an exemplary device 300 comprising a tube-shaped light source 302 surrounded by a transparent structure 304. One may dispose the present quantum confinement material compositions on or within a solid surface, such as a transparent solid surface 304. The transparent solid surface 304 should permit the light source wavelength to activate the subject quantum confinement materials so that the emission wavelength reaches the plant. One may use varying degrees of opacity if desired, depending on the wavelengths of light to be used for photoactivation, as well as the wavelength for emission. The transparent solid surface 304 may be of any material, such as silica glass, a carbon polymer, a ceramic, and any combination thereof. The transparent solid surface may be rigid or flexible. One may dispose the present quantum confinement materials as a thin film, for example, on a thicker surface. Generally, the thinner the transparent solid surface, the less light is optically changed and the more efficient the wavelength transmission. One may use various lenses and other optical devices to influence the intensity and location of light in conjunction with the present devices.

Figure 4:
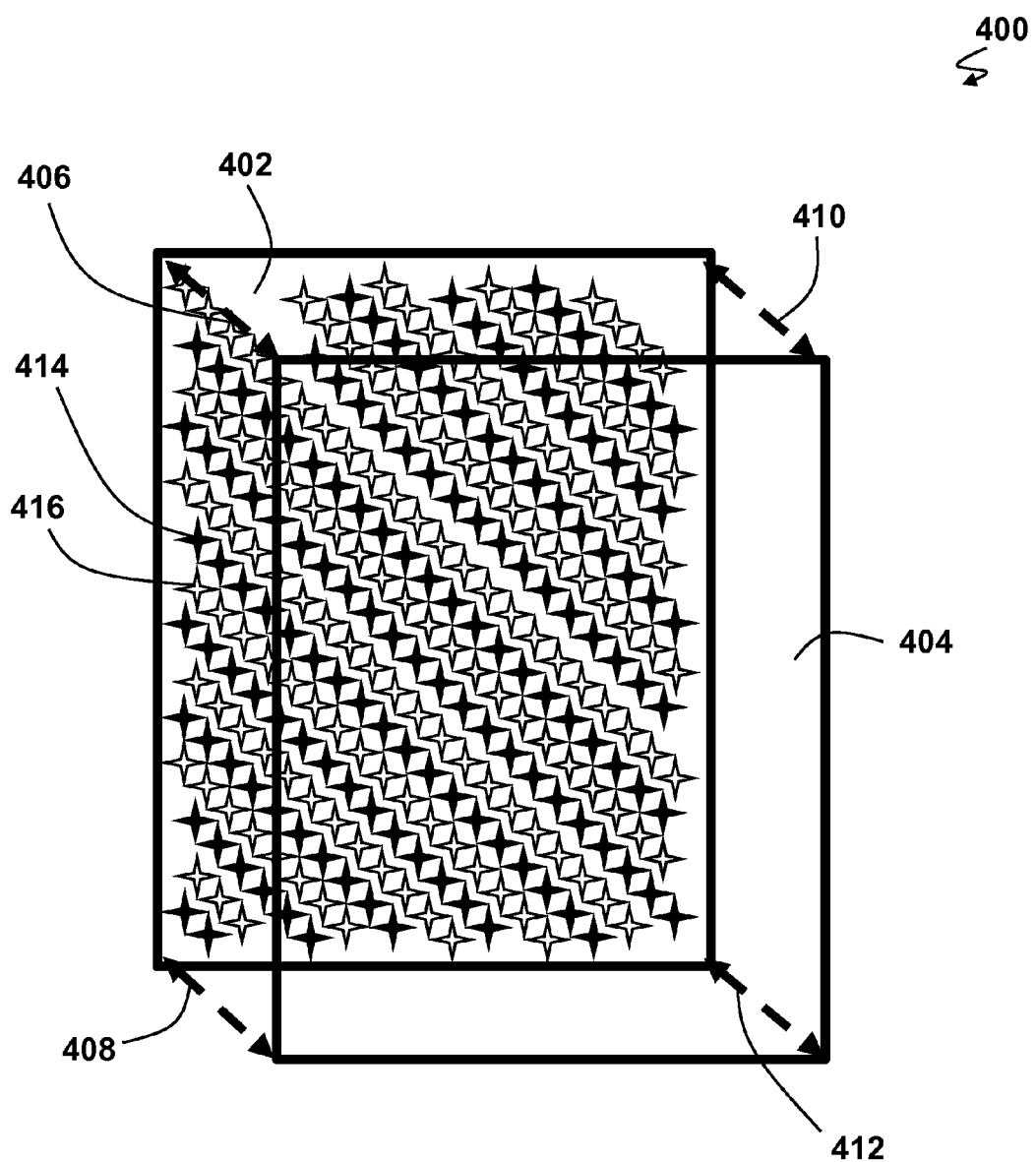
FIG. 4 depicts an exemplary device comprising a first transparent surface and a second transparent surface adjoined in a parallel fashion.

FIG. 4 depicts an exemplary device 400 comprising a first transparent surface 402 and a second transparent surface 404 adjoined in a parallel fashion. The first transparent surface 402 having a top and bottom planar surface, and the second transparent surface 404, having a planar top and bottom surface, may be adjoined along the planar surface at particular locations, e.g., at each of the four corners 406,408,410,412, such that the bottom plane of the second transparent surface 404 is adjoined in a parallel fashion to the top planar surface of the first transparent surface 402. Such adjoining may be by an adhesive at each of the four corners 406,408,410,412. Quantum confinement materials having red emission 414 and blue emission 416 are dispersed as a coating on top of the first transparent surface 402, on the plane facing the underside of the second transparent surface 404.

Figure 5:
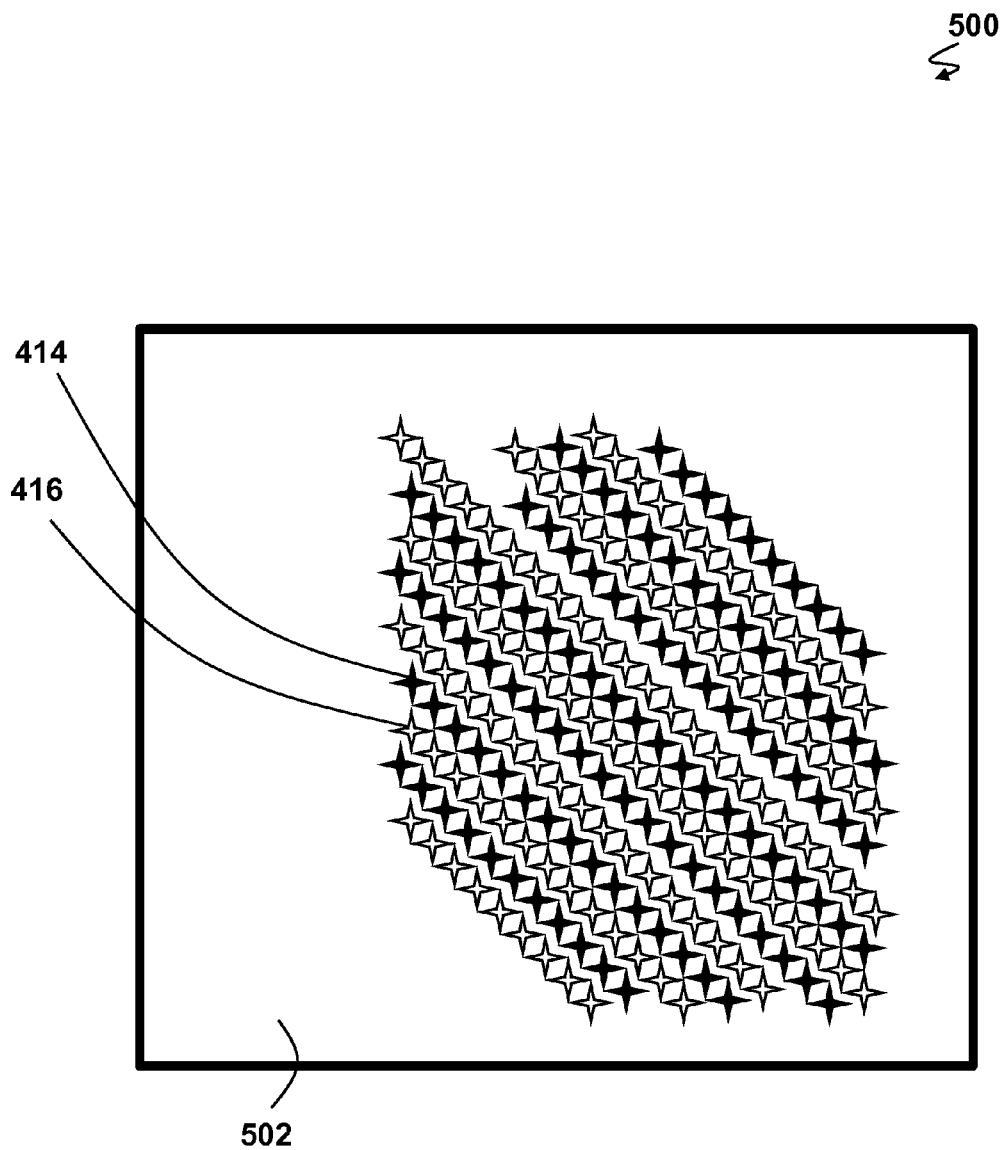
FIG. 5 depicts an exemplary device comprising a transparent surface embedded with quantum confinement materials having blue emission and red emission.

FIG. 5 depicts an exemplary device 500 comprising a transparent surface 502 embedded with quantum confinement materials having blue emission 416 and red emission 414. Alternatively, a device of the present invention may have the desired quantum confinement material compositions 414,416 remain in liquid form. For instance, clear tubing may be first placed in a desired configuration, e.g., in a greenhouse or indoor growing area, and then a suitable liquid PAR-emitting quantum confinement material composition 414,416 could be injected to fill the tubing. Pouches, and other forms suitable for holding liquid, may be used with consideration as to strength, re-usability, and light transmission.

Methods of Making Compositions

An exemplary method of making compositions may comprise a selection of an activation wavelength, a selection of an emission wavelength, and mixtures.

Although there may be several quantum confinement material compositions having a selected emission wavelength, one may prefer a particular activation wavelength depending on the activation source. Activation wavelength may be determined by configuration, e.g., the use of Sunlight or artificial light.

Emission wavelength may be determined on the basis of the plant type, the plant growth or reproductive stage, and the overall energy efficiencies desired. Other factors, such as cost, environmental detriment, and lifespan may be considered.

One may combine quantum confinement materials that are activated by various wavelengths, and/or emit various wavelengths. The present quantum confinement material compositions may be comprised of, consist of, or consist essentially of one or more quantum confinement material types having the same or different activation or emission wavelengths. One may use one or more of the quantum confinement materials in Table 1 alone or in combination with one or more of the quantum confinement materials of Table 2. Similarly, one may use one or more of the quantum confinement materials of Table 2 alone or in combination with one or more of the quantum confinement materials of Table 1. All, or some, of the quantum confinement materials may be functionalized, and, as set forth above, additional moieties, such as dispersion agents and adhesives may be included. One should consider possible interference between or among activation wavelengths, as well as emission spectra.

Methods of Making Devices

Methods of making devices may comprise a selection of compositions and surfaces, and a selection of light sources.

A variety of means to coat or embed the present quantum confinement material compositions onto, or within, a surface may be used. One may prepare the present compositions to spray or brush onto a surface, or, if particles are used, for mixing such particles in a liquid as to coat the particles. One may also prepare inkjet technology to precisely deposit the quantum confinement material on a surface. Where suitable for precise configurations, one may use epitaxy methods in conjunction with a suitable surface substrate. One may also prepare a solid surface embedded with the present quantum confinement material. One may mix a suitable polymeric composition in liquid form with suitable quantum confinement materials as described herein for cross linking and solidifying. Various cross linking agents may be used.

One may use a variety of activation sources, such as any number of combinations of Sunlight and artificial light. One may use various conventional growing lights, such as HPS. Lasers and other light sources not conventionally used for horticultural purposes may also be used as an activation wavelength source. One may use additional reflectors and lenses. For instance, reflectors, such as mirrored surfaces, may be used to focus light sources onto the plant surfaces. Lenses may be used to separate or concentrate particular wavelengths. Because such lasers are optically focused, one may use additional lenses to separate, or amplify, the beam. Where more than one activation wavelength is required, one may use a plurality of lasers.

Methods of Using Compositions

Methods for using the present compositions include, but are not limited to, preparing a device of the present invention. One may spray, brush, coat, mix, apply, or embed the present quantum confinement material compositions on to a surface in a variety of ways and configurations. Additionally, as set forth in Example 4 below, one may use the present compositions such that the light is emitted on or within the plant. One may prepare an aqueous formulation of a suitable phosphor dot, for instance, to be taken up by the plant, along with water, e.g., through the roots or stomata, such that the phosphor dot is activated and PAR light is emitted within the plant itself. The present invention thus contemplates a formulation of the present quantum confinement materials with plant nutrient solutions. This may be particularly appropriate for hydroponic horticultural applications.

Similarly, one may prepare an aqueous formulation of a suitable non-toxic phosphor dot to be carried on or within a microbial agent suitable for residing on or within a subject plant, to deliver a light-converting source, the phosphor dots, in close proximity to the chloroplasts or other light-to-energy converting moieties. The present invention thus contemplates a formulation of the present quantum confinement materials with non-harmful, as well as beneficial, plant microbial compositions.

Methods of Using Devices

The present devices may be used with a natural or artificial light source, and it is contemplated that some embodiments of the present invention may include an artificial light source. Other embodiments may rely on an external light source and/or natural Sunlight.

Where an artificial light source is used, such as HPS, the present devices may be an assembly comprising an artificial light source and a surface having photosynthetically active quantum confinement materials disposed thereon, or embedded therein (see FIGS. 2-3). Fully or partially surrounding the artificial light source is a surface comprising, consisting of, or consisting essentially of a quantum confinement material composition wherein the quantum confinement material composition contains one or more of (a) a quantum confinement material that emits light in the red range upon activation at the wavelength emitted by the artificial light source; and (b) a quantum confinement material that emits light in the blue range upon activation at the wavelength emitted by the artificial light source. FIG. 4 illustrates a transparent surface 402,404 having such quantum confinement materials 414, 416 embedded therein, rather than disposed on the surface.

Where artificial light is not relied upon, or where natural Sunlight is used for activation, the present invention contemplates embodiments of a window, and, relatedly, adjacent windows configured as a greenhouse. As used herein, the term "window" denotes an opening, especially in the wall of a building, for admission of light and air that is usually closed by casements or sashes containing a transparent material, e.g., glass, that is capable of being opened and shut. As used herein the term "greenhouse" denotes "a structure enclosed (as by glass) and used for the cultivation or protection of tender plants." The use of either transparent or translucent glass, e.g., borosilicate, or transparent or translucent plastic, e.g., hydropolymers, is contemplated for all, or part of, the present windows or greenhouses. Other materials that may be sufficiently transparent, or translucent, to permit Sunlight, or artificial light, to activate the quantum confinement materials for emission of photosynthetically active radiation may be used. For example, transparent ceramics and fiber glass may be suitably practicable.

For a window, the present invention contemplates a transparent material that may be framed by a casement or sash and located within a wall, door, or other opaque surface. The present quantum confinement material compositions are disposed upon or embedded within the transparent material (see FIGS. 4 and 5). Some windows may be dual pane and have the present quantum confinement material compositions disposed on the inner surface of a pane, i.e., facing another transparent pane.

In some embodiments, the present invention may include a greenhouse comprised of adjoining windows, where one or more of the windows further comprise a quantum confinement material composition of the present invention. In other greenhouse embodiments, the present invention may comprise a rigid frame surrounded by transparent plastic, where the plastic is disposed upon or embedded within a quantum confinement material composition of the present invention.

EXAMPLES

Figure 6:
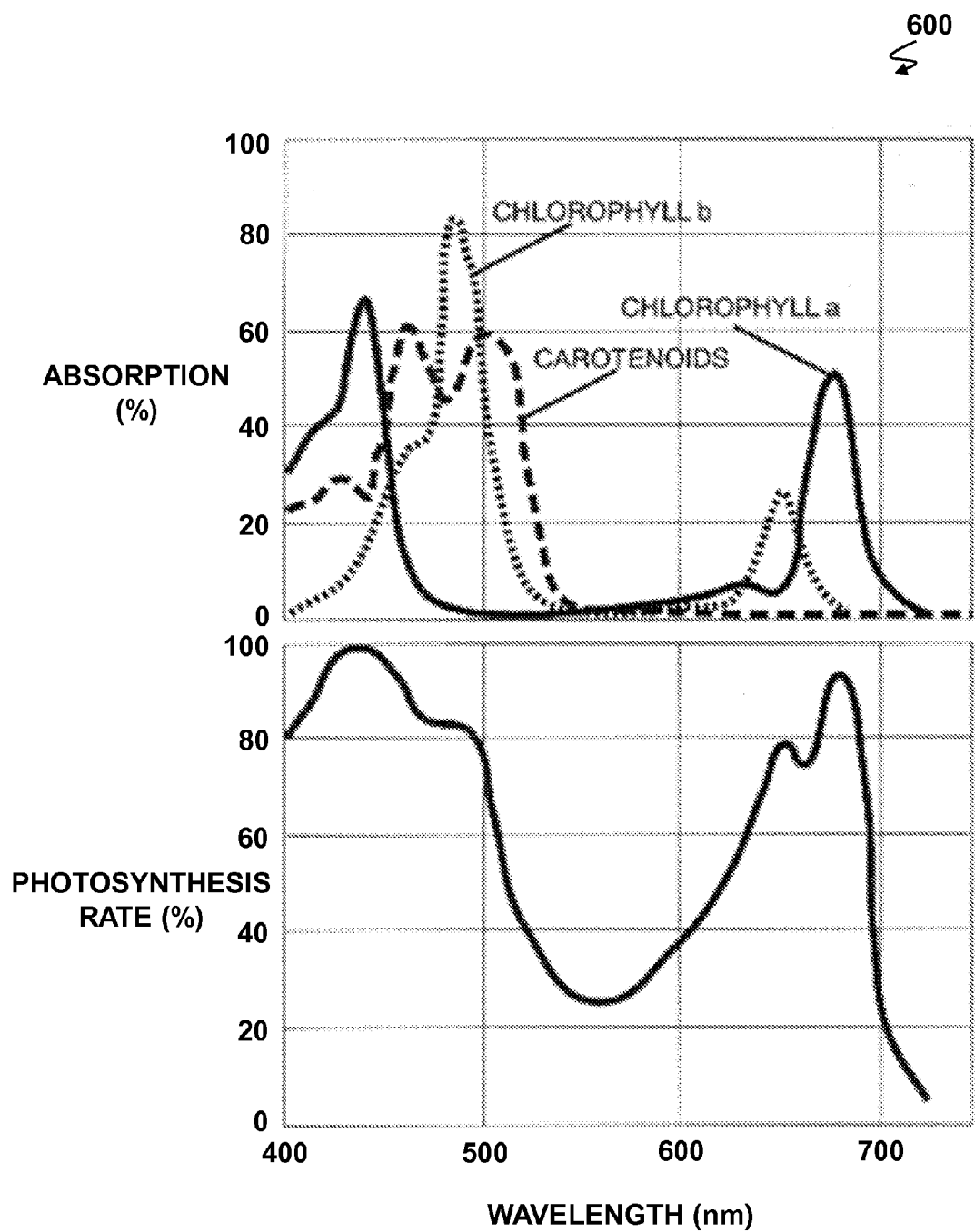
FIG. 6 shows a chart of photosynthetically active radiation and the chlorophyll absorption spectra.

FIG. 6 shows a chart of photosynthetically active radiation and the chlorophyll absorption spectra 600. Based on the graph presented in FIG. 6, a variety of different ratios may be used to create a quantum confinement material lighting source that would scavenge unused radiation, both UV and IR, to convert to usable light for plant growth. Prophetic Examples 1-3 provide different combinations depending on the growth and/or reproduction stage of the plant targeted. Prophetic Example 4 provides energy efficiency calculations and prophetic Example 5 describes a mixture of red emitting quantum confinement materials and blue emitting quantum confinement materials prepared as applied to a plant. Prophetic Example 6 provides a mixture of red emitting quantum confinement materials and blue emitting quantum confinement materials as applied to window technology.

Although the excitation and emission wavelengths are expressed in terms of nanometers, the nanometer measurement includes a possible variation of 0 nm to 0.5 nm shorter and 0 nm to 0.5 nm longer, as well as the exact nanometer amount.

Example 1

Vegetative Growth Boost Quantum Confinement Material Mixture and Device

This prophetic example provides blue light as the primary color, as it has been shown by decades of growth with metal halide bulbs in commercial greenhouses to provide more vegetative matter.

Device Preparation

The present quantum confinement material preparation is applied to a borosilicate sheet of 20 inches×20 inches, and 1 mm thick, although one skilled in the art will recognize that other sizes may be used. For an area of this size, the amount of quantum confinement material preparation needed will be 25.8 ml for a 0.1 mm thick layer. Spread evenly a preparation containing: a 50.01-99% w/w quantum confinement material preparation having a concentration of 10 mg/ml solvent with an excitation wavelength of 980 nm that emits blue light, such as an emission wavelength of 450 nm; and a 1.00-49.99% w/w quantum confinement material preparation having a concentration of 10 mg/ml solvent with an excitation wavelength of 300 nm that emits red light, such as an emission wavelength of 650 nm.

Evaporate the solvent with a heat tunnel at 300 F. Glue another 1 mm thick borosilicate sheet such that the adhesive is attached at the rim or edges of the initial panel in order to seal the quantum confinement materials into the device, as illustrated in FIG. 4.

Example 2

Bloom Boost Quantum Confinement Material Mixture and Device

Based on the graph presented in FIG. 6 a variety of different ratios may be used to create a quantum confinement material lighting source that would scavenge unused radiation, both UV and IR, to convert to light usable for plant growth. This prophetic example provides red light, because it changes phytochrome to the biologically active form that controls key components of the plant reproductive phase, e.g., germination, growth, flower formation, fruiting, etc.

Device Preparation

The present quantum confinement material preparation is applied to a borosilicate sheet of 20 inches×20 inches, and 1 mm thick, although one skilled in the art will recognize that other sizes may be used. For an area of this size, the amount of quantum confinement material preparation needed will be 25.8 ml for a 0.1 mm thick layer. Spread evenly a preparation containing: a 1.0%-49.99% w/w quantum confinement material preparation having a concentration of 10 mg/ml solvent with an excitation wavelength of 980 nm that emits blue light, such as an emission wavelength of 450 nm; and a 50.01%-99.0% w/w quantum confinement material preparation having a concentration of 10 mg/ml solvent with an excitation wavelength of 300 nm that emits red light, such as an emission wavelength at 650 nm.

Evaporate the solvent with a heat tunnel at 300 F. Glue another 1 mm borosilicate sheet such that the adhesive is attached at the rim or edges of the initial panel in order to seal the quantum confinement materials into the device, as illustrated in FIG. 4.

Example 3

All Purpose Growth Quantum Confinement Material Mixture and Device

Based on the graph presented in FIG. 6 a variety of different ratios could be used to create a quantum confinement material lighting source that would scavenge unused radiation, both UV and IR, to convert to light usable for plant growth. This prophetic example provides quantum confinement material excitation frequency in the IR range. High pressure sodium bulbs waste energy as heat. This heat sits above the near infrared region, close to the excitation frequency of $H_2O$ which is in the 4.3 um range.

Device Preparation

The present quantum confinement material preparation is applied to a borosilicate sheet of 20 inches×20 inches, and 1 mm thick, although one skilled in the art will recognize that other sizes may be used. For an area of this size, the amount of quantum confinement material preparation needed will be 25.8 ml for a 0.1 mm thick layer. Spread evenly a preparation containing: a 50% w/w quantum confinement material preparation having a concentration of 10 mg/ml solvent with an excitation wavelength of 980 nm, or 300 nm, that emits blue light, such as an emission wavelength of 450 nm; and a 50% w/w quantum confinement material preparation having a concentration of 10 mg/ml solvent with an excitation wavelength of 300 nm that emits red light, such as an emission of 650 nm.

Evaporate the solvent with a heat tunnel at 300 F. Glue another 1 mm borosilicate sheet such that the adhesive is attached at the rim or edges of the initial panel in order to seal the quantum confinement materials into the device, as illustrated in FIG. 4.

Example 4

Energy Efficiency Calculations

This prophetic example compares the potential energy savings by using the present invention versus commercial-grade high pressure sodium lights commonly used for horticultural purposes.

To illustrate the wasted energy, consider that a commercially available 1000 W high pressure sodium bulb typically produces approximately 100,000 lumens of light at roughly 100 lumens per watt. A commercial grade 600 W high pressure sodium bulb, however, typically produces 140 lumens per watt—an additional 40% output with this smaller bulb. Presumably, a large amount of energy is lost in a 1000 W bulb due to the amount of energy required to ignite the bulb. This energy is then shed not as light, i.e., lumens, but rather as heat, i.e., infrared wavelengths. The present invention, using quantum confinement material technology, effectively changes this wasted heat into usable light, and the light emitted is within the photosynthetically active radiation regime. One may specifically tune such photosynthetically active emission wavelengths for the stage of the plant life cycle, such as growth, blooming, etc. Moreover, one may selectively tune the emission wavelength depending on the plant and its photosynthetically active constituents, such as chlorophyll compositions and phytochrome compositions (see FIG. 6).

Conservatively estimating a 30% inefficiency in a 1000 W HPS bulb (estimated from the above illustration based on scaling from a 600 W HPS bulb to a 1000 W HPS bulb, and reducing by 10%), and assuming a quantum confinement material 90% emission efficiency, the quantum confinement materials, for the same energy input as a 1000 W HPS bulb, emit 27% more usable light. Put another way, to obtain 27% more usable light, 30% inefficiency (0.9 theorized efficiency of quantum confinement materials), assuming gathering of all wasted radiation in infrared and UV, there would be 27% more usable light for photosynthetic radiation. Even assuming lower wattage HPS bulbs, such as a 600 W HPS bulb, the efficiencies could be realized due to the "tunability" of the selected wavelengths. A 600 W bulb could be used, therefore, to produce the same effective amount of light as a 1000 W HPS bulb, considering the desired wavelength emissions. This would result in a 400 W improvement in efficiency in this example.

Example 5

Mixture of Red and Blue Emitting Quantum Confinement Materials Prepared as Applied to a Plant For use on or within a plant, water soluble quantum confinement materials are particularly of interest. For instance, one may seek to have quantum confinement materials enter the plant systemic circulation to convert light in situ, within the plant systemic circulation, or within plant cells. One may desire a plant surface coating with such quantum confinement material compositions. One may desire nontoxic materials for this purpose, depending on the plant type and the ultimate use of the plant.

One may prepare a composition for uptake by a plant itself, such that quantum confinement materials emitting photosynthetically active radiation are within the plant, close to where photosynthesis occurs. Thus, the light emitted from a broad-spectrum source, e.g., high pressure sodium or Sunlight, will be converted to photosynthetically active radiation within the plant itself. Such compositions will preferably use quantum confinement materials that are non-toxic to the plant, and, if such plant is to be ingested, non-toxic for ingestion. Silicone-based, non-toxic, biodegradable quantum confinement materials may be dispersed in water such that they are taken up by the plant itself when delivered through the roots, thereby delivering quantum confinement materials systemically through the plant. These compositions may be part of a hydroponic solution, and may also include plant nutrients.

A number of embodiments of the present invention flow from the use of quantum confinement materials within a plant to have localized increased efficiency of photosynthetically active radiation. The present invention includes a plant and any portion thereof containing within it a quantum confinement material, and, more particularly, a quantum confinement material that emits photosynthetically active radiation. The present invention includes a plant nutrient solution containing, comprising, consisting of or consisting essentially of a quantum confinement material that emits photosynthetically active radiation. One may prepare a composition comprising, consisting of, or consisting essentially of a quantum confinement material having an emission in the red spectrum, a quantum confinement material having an emission in the blue spectrum, and a plant nutrient solution. One may prepare such compositions with either a red emitting quantum confinement material or a blue emitting quantum confinement material.

One may apply similar considerations should one desire to coat the outer surface of a plant. The quantum confinement materials should be non-toxic to the plant and, should the plant be ingested, non-toxic if eaten or otherwise consumed. One may apply such quantum confinement material compositions as a spray.

For application to a plant, one may prepare a composition comprising, consisting of, or consisting essentially of a quantum confinement material having an emission in the red spectrum, a quantum confinement material having an emission in the blue spectrum, and a bacteria or spore thereof, as applicable. One may prepare such composition with either a red emitting quantum confinement material or a blue emitting quantum confinement material.

One may prepare a composition comprising, consisting of, or consisting essentially of a quantum confinement material having an emission in the red spectrum, a quantum confinement material having an emission in the blue spectrum, and a bacteria (or spore thereof) selected from among a *Bacillus* species, a *Pseudomonas* species and a *Fusarium* species. One may prepare suitable bacteria, such as *Bacillus thurigensis*, with the subject quantum confinement material compositions, and apply to plants as a single application. For example, other non-pathogenic bacteria, such as non-pathogenic *Pseudomonas* species, or *Fusarium* species may be used. Particular bacteria, such as *Pseudomonas fluorescens*, are fluorescent, and this may augment the present quantum confinement material energy optimization.

One may similarly prepare non-pathogenic viral or other nucleic-acid based vectors for uptake into a plant. Such vectors may include viruses, or other DNA, RNA, or synthetic nucleic acid, such as aptamer, or mimetic. Thus the present invention may include a composition comprising, consisting of, or consisting essentially of a quantum confinement material having an emission in the red spectrum, a quantum confinement material having an emission in the blue spectrum, and a plant virus, or other nucleic-acid based plant vector.

Example 6

Mixture of Red and Blue Emitting Quantum Confinement Materials as Applied to Window Technology The present invention may include a window, as defined above, comprising a transparent surface having a composition coated on or embedded within the present quantum confinement materials emitting photosynthetically active radiation. The transparent surface may be comprised of a variety of compositions, but will typically comprise a silica glass, a carbon polymer, a ceramic, or any combination thereof. The present invention may also comprise architectural constructs having the present windows, such as a building, and in particular embodiments, a greenhouse as defined above. For windows and relying on Sunlight, the present quantum confinement materials should be activated—excitation wavelength—by Sunlight.

It is contemplated that various combinations and/or subcombinations of the specific features and aspects of the above embodiments may be made and still fall within the scope of the invention. Accordingly, it should be understood that various features and aspects of the disclosed embodiments may be combined with or substituted for one another in order to form varying modes of the disclosed invention. Further it is intended that the scope of the present invention herein disclosed by way of examples should not be limited by the particular disclosed embodiments described above.

What is claimed is:

1. A composition comprising:

(a) a quantum confinement material consisting of a 20-50 nm thulium doped yttrium vanadate colloid having an excitation wavelength of 300 nm and an emission wavelength of 477 nm;

(b) a quantum confinement material selected from:

(i) a 20-50 nm europium doped yttrium vanadate colloid having an excitation wavelength of 300 nm and an emission wavelength of 620 nm;

(ii) a 10 nm europium doped yttrium vanadate colloid having an excitation wavelength of 350 nm and an emission wavelength of 617 nm;

(iii) a 10 -50 nm samarium doped yttrium vanadate colloid having an excitation wavelength of 300 nm and an emission wavelength of 650 nm;

(iv) a 25 nm NaYF4:Yb,Er colloid having an excitation wavelength of 980 nm and an emission wavelength of 545 nm; and (v) an atomic graphene layer with defect points enabling quantum confinement active zones; and (c) an adhesive wherein the adhesive is selected from among an anaerobic adhesive, a cyanoacrylate adhesive, an epoxy, a structural acrylic, and an ultraviolet light curable adhesive.

2. The composition of claim 1 wherein the 20-50 nm europium doped yttrium vanadate colloid having an excitation wavelength of 300 nm and an emission wavelength of 620 nm is in a solvent of <0.7 mg/ml polyvinylpyrrolidone.

3. The composition of claim 1 wherein the 10 nm europium doped yttrium vanadate colloid having an excitation wavelength of 350 nm and an emission wavelength of 617 nm is in a solvent of $H_2O$.

4. The composition of claim 1 wherein the 10-50 nm samarium doped yttrium vanadate colloid having an excitation wavelength of 300 nm and an emission wavelength of 650 nm is in an aqueous solution containing trace citrate if the samarium doped yttrium vanadate colloid is 10 nm, and is in a solution of less than 0.7 mg/ml polyvinylpyrrolidone if the samarium doped yttrium vanadate colloid is 50 nm.

5. The composition of claim 1 wherein the 25 nm NaYF4:Yb,Er colloid having an excitation wavelength of 980 nm and an emission wavelength of 545 nm is in a solvent containing hexane.

6. The composition of claim 1, further comprising:

wherein the quantum confinement material of subpart (a) is in a solvent containing <0.7 mg/ml polyvinylpyrrolidone.

* * * * *